United States Patent [19]
Woolley et al.

[11] Patent Number: 5,935,662
[45] Date of Patent: Aug. 10, 1999

[54] UNWINDING OF PLASTIC FILM IN THE PRESENCE OF A PLASMA

[75] Inventors: Christopher P. Woolley, Martinez; Harvey Rogers, Playa del Rey; John Mourelators, Clayton, all of Calif.

[73] Assignee: The BOC Group, Inc., New Providence, N.J.

[21] Appl. No.: 08/928,574

[22] Filed: Sep. 12, 1997

Related U.S. Application Data

[62] Division of application No. 08/656,395, May 31, 1996, Pat. No. 5,743,966.

[51] Int. Cl.$^6$ .................................. C23C 16/50
[52] U.S. Cl. ................ 427/535; 427/536; 427/539; 427/569; 427/578; 427/177; 427/255.5; 427/209
[58] Field of Search ........................ 427/535, 536, 427/539, 569, 578, 177, 255.5, 209; 118/715, 718, 723 R

[56] References Cited

U.S. PATENT DOCUMENTS

| | | | |
|---|---|---|---|
| 4,411,972 | 10/1983 | Narken et al. | 430/5 |
| 4,429,024 | 1/1984 | Ueno et al. | 428/694 |
| 4,438,723 | 3/1984 | Cannella et al. | 118/718 |
| 4,655,167 | 4/1987 | Nakamuro et al. | 118/718 |
| 4,663,829 | 5/1987 | Hartman et al. | 29/572 |
| 4,664,951 | 5/1987 | Doehler | 427/248.1 |
| 4,723,507 | 2/1988 | Ovshinsky et al. | 118/718 |
| 4,867,101 | 9/1989 | Yamanaka et al. | 118/718 |
| 5,032,461 | 7/1991 | Shau et al. | 428/461 |
| 5,180,433 | 1/1993 | Okudo et al. | 118/718 |
| 5,224,441 | 7/1993 | Felts et al. . | |
| 5,258,074 | 11/1993 | Okudo et al. | 118/718 |
| 5,529,631 | 6/1996 | Yoshikawa et al. | 118/718 |
| 5,652,029 | 7/1997 | Itoh | 427/569 |

OTHER PUBLICATIONS

Andrew Mykytiuk, "Finding a Simple Solution to a Shocking Problem", *Paper Film Foil Converter*, Apr. 1996, pp. 62–63.

*Primary Examiner*—Shrive Beck
*Assistant Examiner*—Timothy Meeks
*Attorney, Agent, or Firm*—David A. Draegert; Salvatore P. Pace

[57] ABSTRACT

Supplying gases towards the web as it separates from the drum in a plasma-enhanced chemical vapor deposition system reduces the sticking of the web to the drum, and thus prevents power supply dropouts. The gas supplied can form into a plasma that helps dissipate the static charge which builds onto the web as it rolls off of the drum. By reducing the arcing and power supply dropouts, the quality of the deposited layer formed in a deposition zone can be improved.

6 Claims, 5 Drawing Sheets

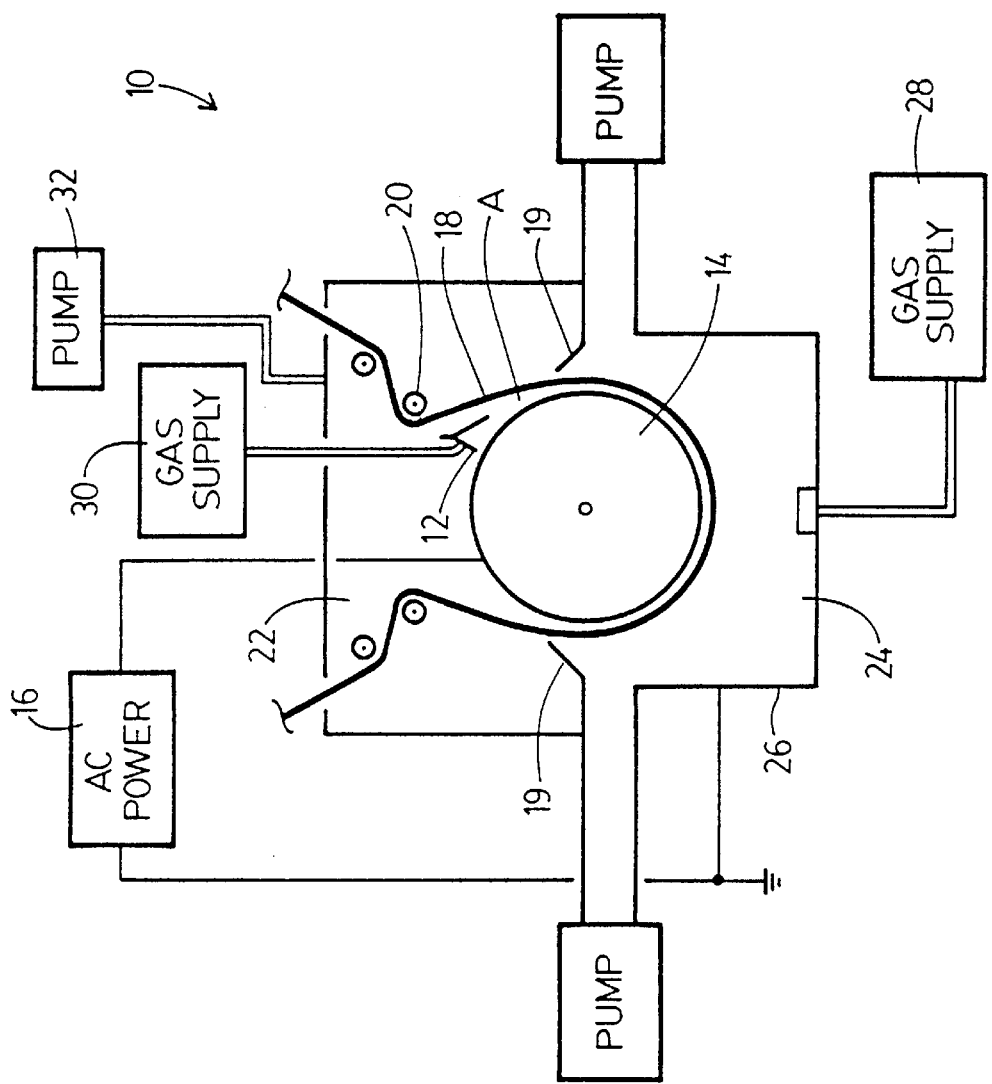
FIG._1.

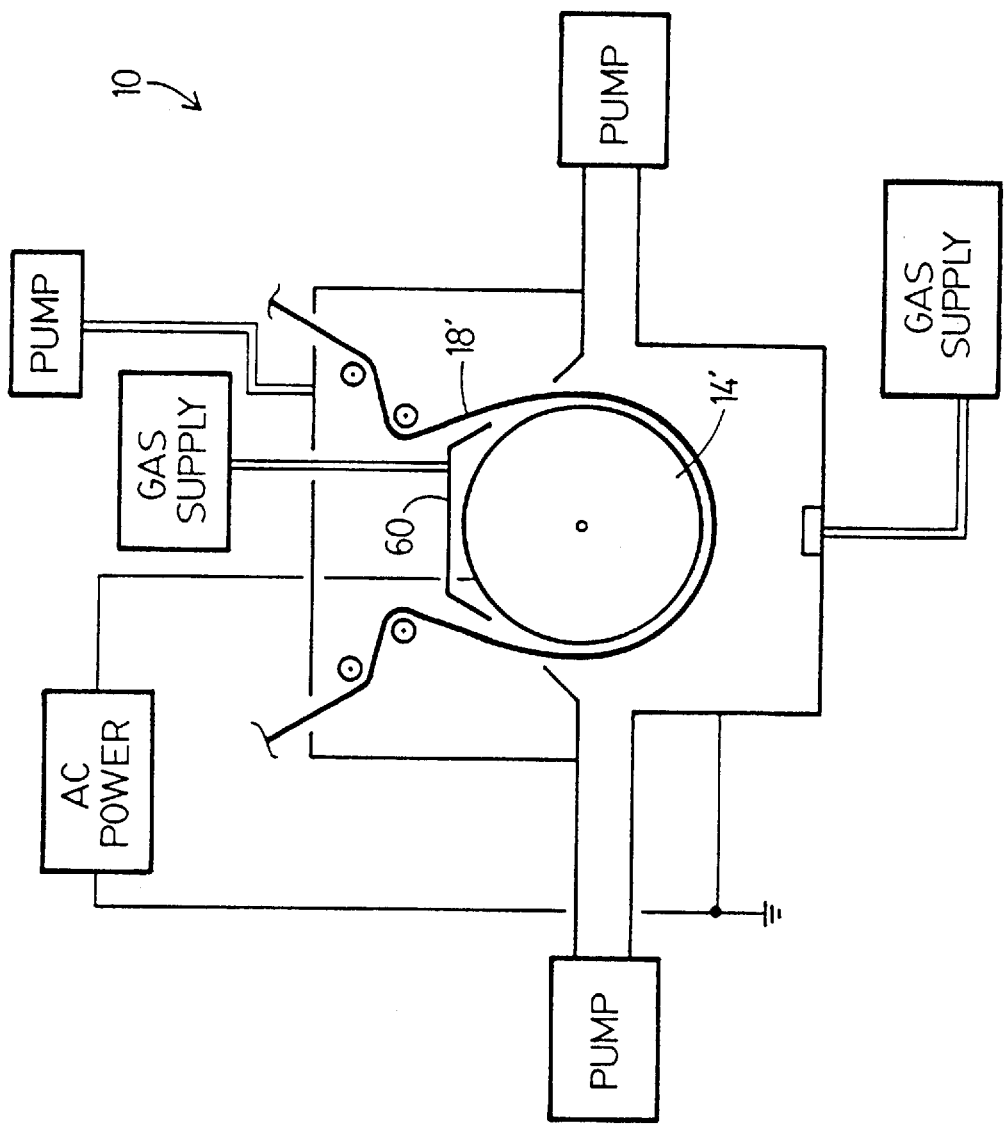
FIG._2.

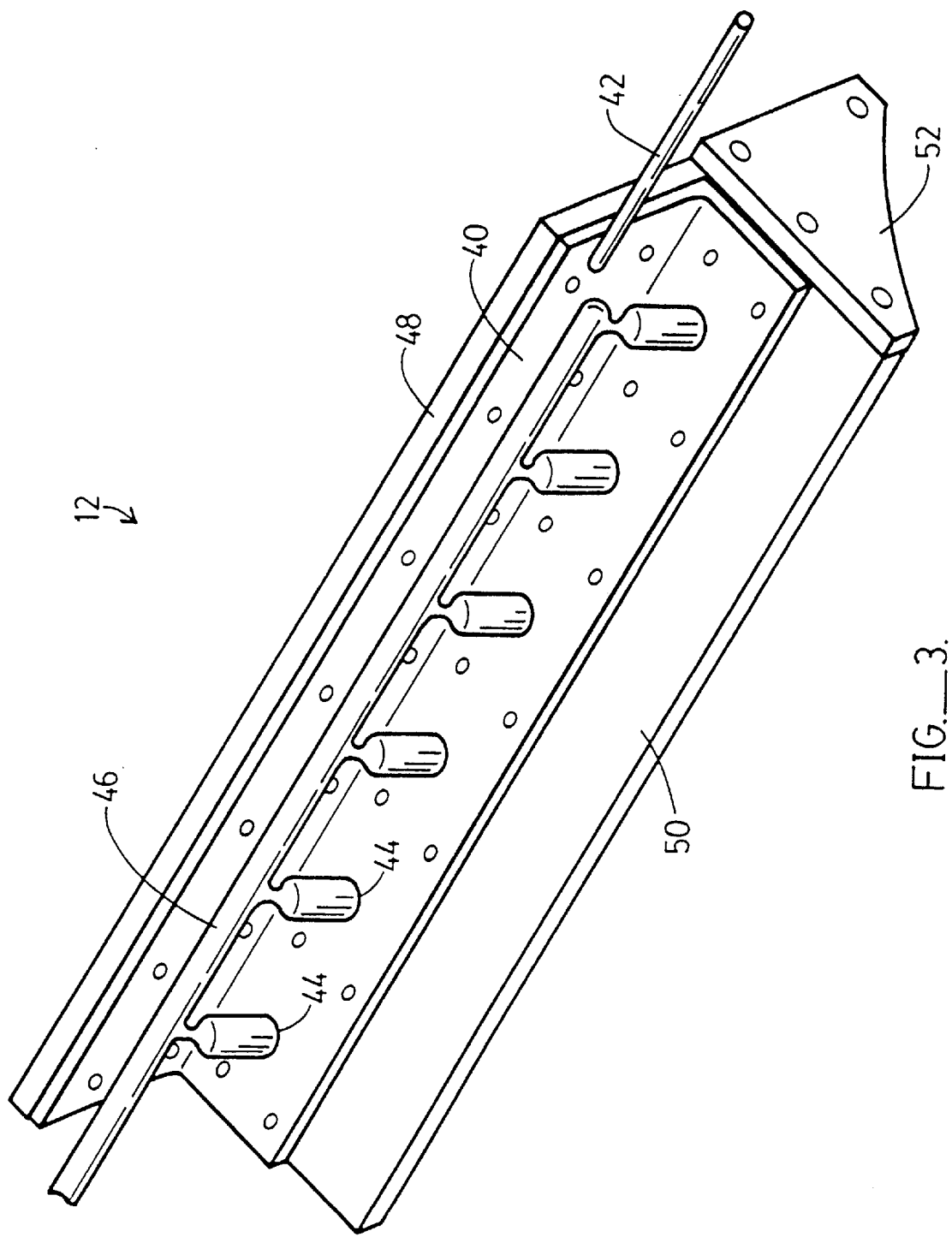
FIG._3.

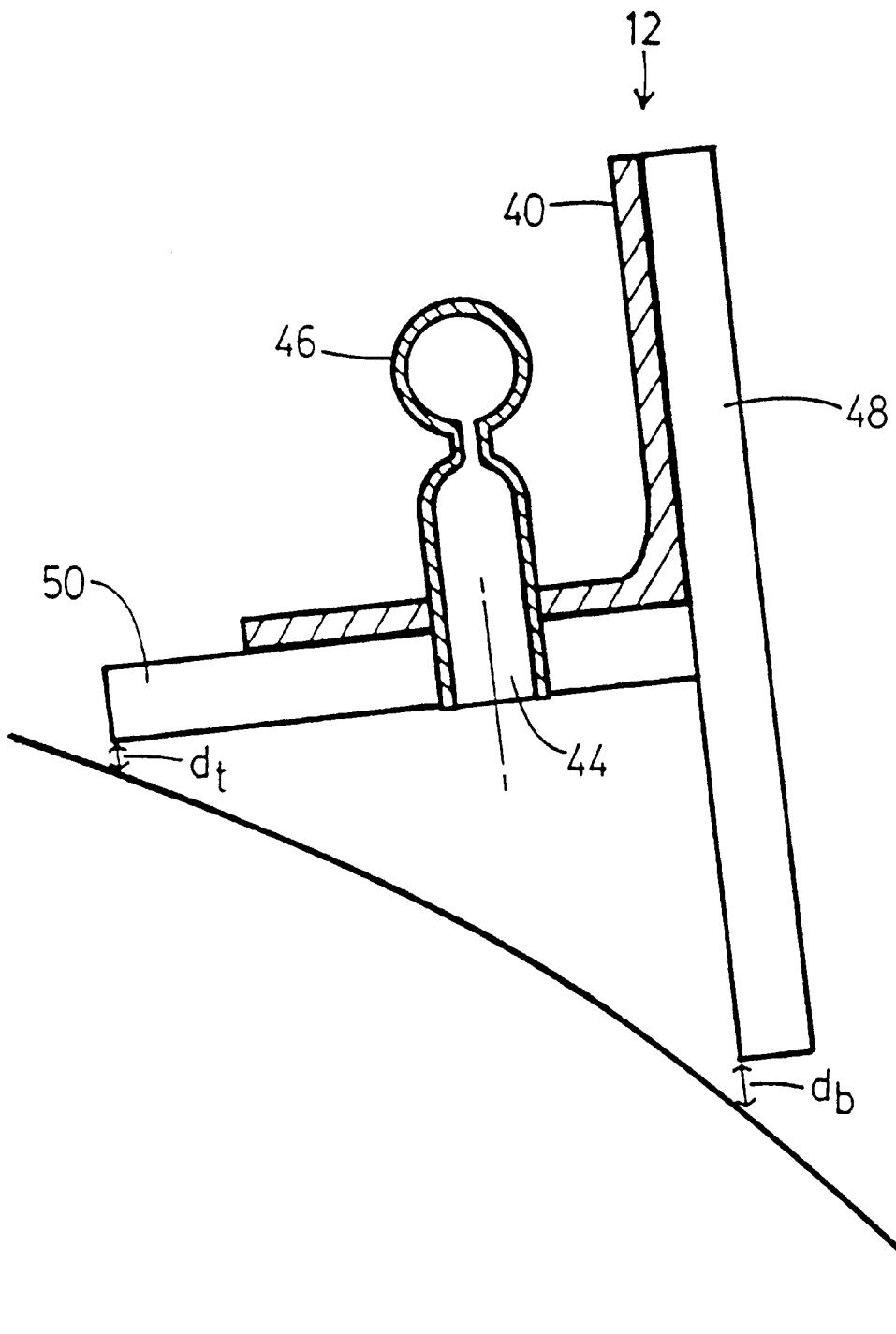
FIG._4.

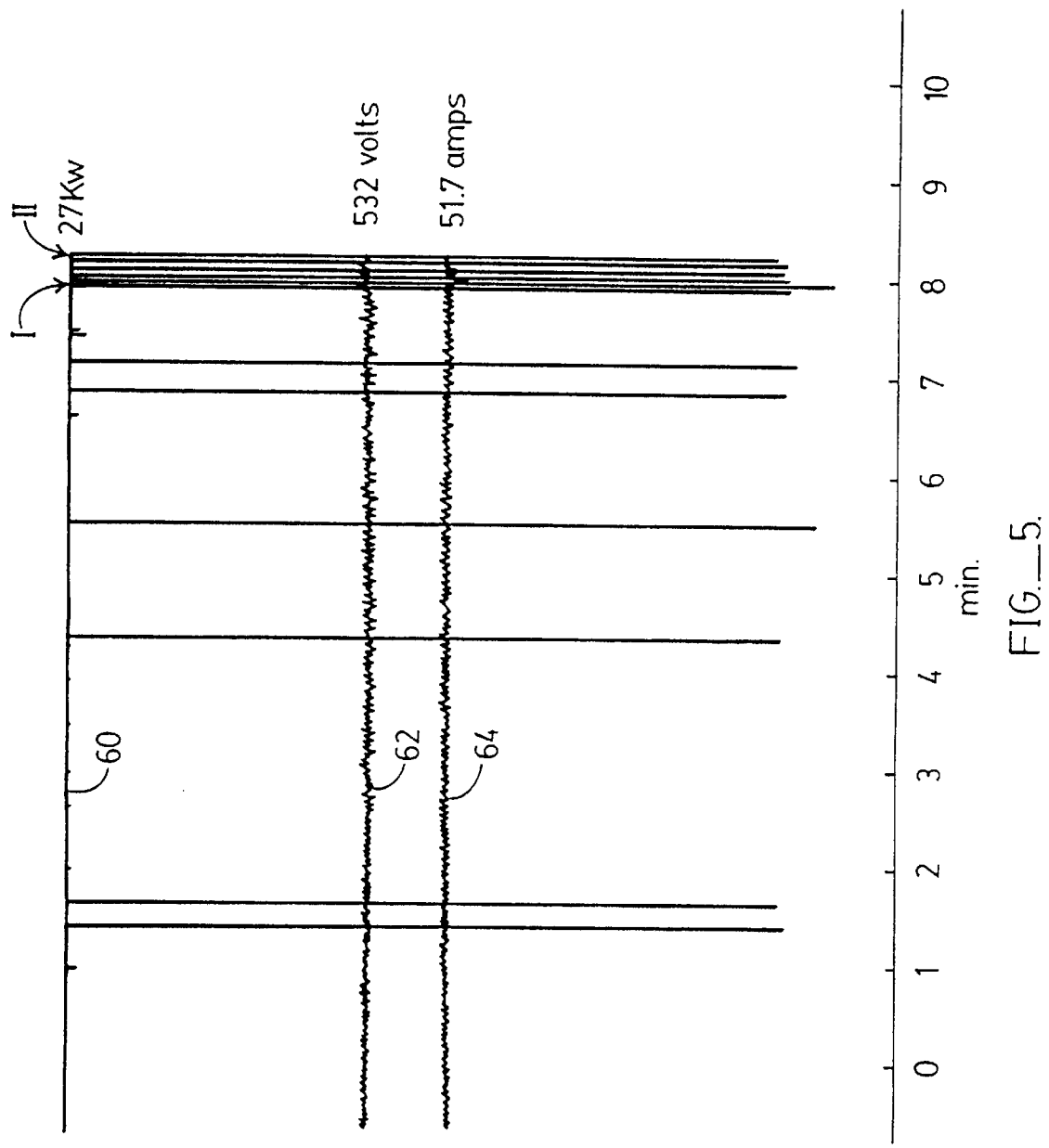
FIG._5.

UNWINDING OF PLASTIC FILM IN THE PRESENCE OF A PLASMA

This is a division of application Ser. No. 08/656,395, filed May 31, 1996, now U.S. Pat. No. 5,743,966.

BACKGROUND OF THE INVENTION

The present invention relates to systems of coating a layer on a plastic film. The invention especially relates to the use of plasma-enhanced chemical vapor deposition (PECVD) to deposit a layer on a film that rolls over a rotatable drum electrode.

An example of such a process is described in Felts, et al. U.S. Pat. No. 5,224,441, which is incorporated herein by reference. In this reference, gases including a monomer (i.e., organosilicon), oxygen, and inert gases (i.e., helium) are introduced into an evacuated chamber. A glow discharge plasma is formed between electrodes powered by the alternating current (AC) power supply. A web substrate moves over a drum electrode and is treated by the plasma so that a silicon oxide layer forms on the web.

A problem that can occur in the plasma-enhanced chemical vapor deposition involves power supply dropouts. In power supply dropouts, the power supply turns off and must be re-started. While the power supply is off, the web continues to roll over the drum electrode. This can cause a reduction in the quality of the deposited layer on the plastic film during the time that the power supply is off.

It is desired to reduce the frequency of power supply dropouts and thus improve the quality of the deposited layer on the film.

The inventors have found that some of the power supply dropouts are caused by the plastic web material sticking to the drum. Static charge builds up on the web, causing it to stick to the drum. When the web sticks to the drum, control over the level of tension on the web is lost. The loss of tension can cause the web to separate from the drum. Good contact with the drum is needed for heat transfer and process stability while traveling through the process zone. Additionally, arcing and power supply dropouts can occur, when the web is eventually ripped off of the drum.

The inventors have found that this problem can be avoided by flowing gases towards the nip where the web is unwound from the drum. When the gases flow towards the web under relatively low pressures, these gases form a plasma. The plasma provides a path for the static charge on the web to dissipate.

This plasma is found in the winding zone, and faces the back of the plastic web material. This plasma is to be distinguished from the process plasma that faces the front of the plastic web material onto which the deposited layer is placed.

The gases which are used to form the plasma can be released into a baffle in the winding zone. The gases flow into the baffle creating a high enough pressure to create a plasma. Then the plasma-charged gases flow from the baffle toward the point where the web separates from the drum. The formed plasma allows for the dissipation of the static charge on the web. The baffle can maintain a pressure differential in the winding zone. The pressure around the baffle and near the point where the web separates from the drum is greater than the pressure in the remaining portion of the winding zone. This allows for diffusion pumps to be used in the winding zone. Additionally, the power used by the plasma in the winding zone can be kept relatively low.

In one embodiment, a baffle that is triangular-shaped in cross-section is used near the location where the web separates from the drum.

In a preferred embodiment, the winding zone and the deposition zone are maintained separately so that the monomer does not enter the winding zone from the deposition zone. In this way, a dielectric layer will not be deposited on the drum electrode.

In a preferred embodiment, the gases used for the plasma in the winding zone will be a subset of the gases used in the deposition zone. In particular, it has been found that a pure oxygen gas or a mixture of oxygen and argon will work particularly well in avoiding the web sticking problem. In a preferred embodiment, around twenty to thirty microns of gas pressure are supplied to the baffle. This compares to around one to two microns of gas pressure in the remainder of the winding zone and about fifty to a hundred microns of pressure in the deposition zone.

Although maintaining a pressure differential between a baffle and the remaining portion of the winding zone is desirable when using diffusion pumps, it is not necessary for this pressure differential to exist in order to reduce web sticking. A uniform pressure could be formed in the winding zone to prevent web sticking. In this alternate embodiment, for example, about twenty to thirty microns of gas pressure can be supplied to the entire winding zone. In this manner, a plasma can be formed to avoid the web sticking.

BRIEF DESCRIPTION OF THE DRAWINGS

The above and other features and aspects of the present invention will become more apparent upon reading the following detailed description in conjunction with the accompanying drawings, in which:

FIG. 1 is a diagram of a plasma-enhanced chemical vapor deposition system using a triangular-shaped baffle in the winding zone.

FIG. 2 is a diagram of a plasma-enhanced chemical vapor deposition system using a larger baffle in the winding zone.

FIG. 3 is a perspective view of the triangular-shaped baffle of FIG. 1.

FIG. 4 is a cross-sectional view of the triangular-shaped baffle of FIGS. 1 and 3.

FIG. 5 is a strip-chart diagram illustrating the power, voltage, and current supplied to the drum.

DETAILED DESCRIPTION OF THE PREFERRED EMBODIMENT

FIG. 1 is a diagram of the plasma-enhanced chemical vapor deposition system 10 using a triangular-shaped baffle 12. In the plasma-enhanced chemical vapor deposition system 10, a metal rotatable drum 14 is connected to the AC power supply 16 so that the metal drum 14 acts as an electrode for the plasma deposition system. A web material 18 rolls over the drum 14 and is guided by rollers 20.

The plasma deposition system is divided into two zones—the winding zone 22 and the deposition zone 24. In the deposition zone 24, a layer such as a silicon oxide layer is formed on the plastic web 18. In the plasma-enhanced chemical vapor deposition, a plasma is formed between the metallic drum and a counter-electrode (in this case the chamber wall) of the evacuated chamber 26. The plasma causes the dissociation of the monomer and results in the deposition of the coating on the web 18. Gas supply 28 supplies the gases for the deposition process. In the preferred embodiment, oxygen, helium and the vaporized monomer are supplied into the deposition zone 24 by gas supply 28.

The baffles 19 in connection with the web 18 help divide the system into the winding zone 22 and the deposition zone 24. It is desired that the monomer not be leaked into the winding zone 22 so that the drum 14 is not coated with dielectric material.

The plastic web 18 rolls continuously on the drum 14 so that different areas on the web 18 are coated with the deposited layer. Not shown in this figure are the baffles and magnets in the deposition zone 24 used for shaping the plasma around the web 18 to improve the deposition. Gas supply 30 provides the gases to the baffle 12. In the preferred embodiment, these gases comprise pure oxygen or an argon/oxygen mix. The use of pure argon was found to be less desirable.

The gases supplied through the baffle are directed to the point A where the web 18 separates from the drum 14. The use of a baffle helps maintain the pressure differential in the winding zone 22. In a preferred embodiment, the gas pressure in the baffle area is about twenty to thirty microns. The pressure in the remainder of the winding zone 22 is preferably less than about five microns. In a preferred embodiment, this gas pressure is preferably one to two microns. This compares to the fifty to one hundred microns of pressure that is typically found in the deposition zone 24. Maintaining two different pressures in the winding zone 22 helps the diffusion pump 32 to operate efficiently.

FIGS. 3 and 4 show a more detailed description of the baffle 12 used in FIG. 1. FIG. 3 is a perspective view of the triangular-shaped baffle shown in FIG. 1. This baffle includes an L-shaped metal structure 40 which is connected by a brace bar 42 to the ground. In the preferred embodiment, there are six gas injector ports which are connected by a plumbed line 46 to the gas supply (not shown). The baffle 12 also includes plastic parts 48, 50 and 52. Note that part 52 can be curved so as to follow the shape of the drum (not shown).

FIG. 4 is a cross-sectional view of the triangular-shaped baffle 12 shown in FIGS. 3 and 1. The gases flow through the port 44 form a plasma in the baffle. In the preferred embodiment, the distance $d_b$ between the bottom of the baffle and the drum is about 3/16"; the distance $d_t$ between the top of the baffle and the drum is about 1/64". FIG. 2 is a diagram of a plasma-enhanced chemical vapor deposition apparatus 10' using a larger baffle 60. This larger baffle 60 can be extended almost from one side of the web 18' to the other.

An alternative to using the baffle for supplying the gases to the web 18' as it separates from the drum 14' can include the use of a hollow anode that produces a plasma as gases flow through a hollow metal tube. The hollow metal tube would be grounded so that a plasma would be formed between the hollow anode and the drum electrode.

FIG. 5 is a diagram illustrating the power 60, voltage 62, and current 64 supplied to the drum. The power 60 is at about 27 kilowatts, the voltage 62 is at about 532 volts and the current 64 is at about 51.7 amps. Until time I, gases are supplied to the baffle as described above. There are drop-outs in the power supply due to arcing, but these occur relatively infrequently. At time I, the gas supply to the baffle is turned off. Notice that the number of power supply drop-outs increases dramatically. At time II, the power is turned off. As discussed above, power supply dropouts can cause a reduction in the quality of the coat.

Various details of the implementation and method are merely illustrative of the invention. It will be understood that various changes of these details may be within the scope of the invention, which is to be limited only by the appended claims.

What is claimed is:

1. A method comprising the steps of:

rolling a web over a rotatable drum in an evacuated chamber;

forming a layer on one side of the web using plasma deposition; and dissipating static electricity from the web by forming a plasma on a drum side of the web so that the web does not stick to the drum, the dissipating step including using a baffle to direct the plasma toward a point where the web separates from the drum.

2. The method of claim 1, wherein the layer forming step comprises plasma-enhanced chemical vapor deposition of the layer.

3. The method of claim 1, wherein the dissipating step includes providing a flow of gas toward a point where the web separates from the drum.

4. The method of claim 1, wherein the dissipating step further comprises maintaining a gas pressure in an area within a winding zone and adjacent the baffle which is greater than that in the remainder of the winding zone.

5. The method of claim 1, wherein the dissipating step further comprises maintaining a relatively uniform gas pressure in a winding zone.

6. A method comprising the steps of:

rolling a web over a rotatable drum in an evacuated chamber;

forming a layer on one side of the web using plasma-enhanced chemical vapor deposition, wherein gases are supplied for this plasma-enhanced chemical vapor deposition; and supplying gases and forming a plasma on a drum side of the web to reduce a sticking of the web to the drum, wherein the supplying step comprises using a baffle to direct the gases toward a point where the web separates from the drum.

\* \* \* \* \*